United States Patent [19]

Podowski

[11] 3,953,801
[45] Apr. 27, 1976

[54] RECEIVER DIGITAL CONTROL SYSTEM
[75] Inventor: Robert R. Podowski, Elmhurst, Ill.
[73] Assignee: Zenith Radio Corporation, Chicago, Ill.
[22] Filed: June 3, 1974
[21] Appl. No.: 475,739

[52] U.S. Cl. ............................... 325/464; 325/390
[51] Int. Cl.² ........................................... H04B 1/26
[58] Field of Search ........... 325/418, 419, 464, 465, 325/459, 468, 470; 323/63, 66; 307/220, 221; 340/347 DA; 178/DIG. 15; 334/15; 328/37, 48, 50

[56] References Cited
UNITED STATES PATENTS

| | | | |
|---|---|---|---|
| 3,740,651 | 6/1973 | Mons | 334/15 X |
| 3,746,886 | 7/1973 | Konopka | 334/15 X |
| 3,748,645 | 7/1973 | Kowashima | 325/465 X |
| 3,801,835 | 2/1974 | Tasso et al. | 328/48 X |

*Primary Examiner*—Benedict V. Safourek
*Attorney, Agent, or Firm*—Nicholas A. Camasto; Roy A. Ekstrand

[57] ABSTRACT

A broadcast receiver has a reversible binary counter having its output coupled to a digital-to-analog converter which translates the counter's binary coded output signal to a control voltage and applies it to a voltage controllable circuit means. A local source of clock pulses is selectively coupled to the counter by a pair of operator actuated switches to preferentially alter the counter output signal. The binary coded counter output signals are coupled to a non-volatile memory by read/write means for storage during periods of receiver deactivation and reimposed on the counter during subsequent activation of the receiver. Receiver activation and deactivation transitions are detected by voltage sensing means which are coupled to the read/write means and are responsive to changes in the receiver operating potential. Preset means comprising a non-volatile, non-erasable memory and selector switches permit resetting the counter to a predetermined binary data configuration.

10 Claims, 2 Drawing Figures

RECEIVER DIGITAL CONTROL SYSTEM

BACKGROUND OF THE INVENTION

This invention relates generally to color television and stereophonic broadcast receivers and more particularly to the preference controls thereof. Color television receivers provide a number of viewer acccessible preference controls, among them being controls for the adjustment of receiver characteristics such as contrast, brightness, hue, color saturation, volume and in some cases, video peaking or sharpness. Similarly stereophonic receivers provide preference controls for volume, balance, bass and treble. The difficulty of properly setting such a variety of controls for the average unsophisticated user has stimulated development of automatic systems for the correction of transmission caused errors and preset control systems to assist the viewer in adjusting receiver preference controls.

Automatic systems generally comprise receiver circuitry which is responsive to changes or aberrations of the received signal and affects appropriate compensation to minimize the degradation of receiver performance caused by such aberrations. Such systems are not generally accessible to the viewer and do little to compensate for misadjustment of receiver preference controls but rather are directed toward maintaining proper reception and recovery of the broadcast information. Stereophonic receivers often provide such automatic systems for maintenance of a substantially constant audio level and station tuning. Color television receivers may provide automatic systems operative on the receiver characteristics of color saturation, hue, brightness, contrast and channel tuning.

Because these automatic systems do little to compensate for misadjustment of receiver preference controls, television receiver manufacturers often provide a control system which enables the viewer or operator to impose a predetermined set of characteristics upon the receiver or at least to confine the controls to within a desirable operating range. These take the form of a non-interactive set of duplicate controls (not accessible to the viewer) which are preadjusted by the manufacturer, and circuitry which limits the available range of operation of the viewer accessible preference controls around a predetermined adjustment. One manufacturer intercouples the duplicate controls to provide a limited range of adjustment of the receiver characteristic in the preset mode.

While the use of such systems provides some assistance to the viewer who has misadjusted the receiver preference controls, the imposition of predetermined characteristics does not change the preference control adjustment and upon a return to preference control operation, the previous misadjusted condition returns. Further, in the preset arrangements incorporating non-interactive duplicate controls, there is no provision for modifying the imposed characteristic. In the event that the presets no longer represent desirable characteristics due to component aging, environmental conditions, program material, or in the event the viewer desires a "set up" which differs from the "norm" of the presets, there is little short of a service adjustment that will be of help. The interactive systems and limited adjustment systems do provide for a measure of change in the receiver characteristic imposed, but the changes are generally insufficient to accommodate the existing variations of viewer taste. Moreover, because the effect of the control and not its range of movement is limited in the preset mode, touch up adjustments often result in even greater misadjustment of the control when returned to preference operation.

The preference controls most often used are potentiometers of either the rotary or slide type which include a contact movable over a resistance element. Such devices are susceptible to mechanical breakage and in time may become noisy or intermittent. Additionally they are not easily nor economically adaptable to remote control applications, because expensive servomotors are needed to drive the movable contact.

Electronic control systems obviate these mechanical problems and are finding increased use in the television industry. They are silent, reliable, compact and readily adopted to remote operation. The development of electronic control systems has been facilitated by recent improvements in receiver preference control circuitry that enables changing a given receiver characteristic in response to a DC control voltage. Prior art preference controls were often operative on the processed signal itself and comprised portions of the signal path connected to the receiver chassis by expensive and unwieldy shielded cables. The advent of DC responsive systems permitted the elimination of such signal bearing connections and made practical preference control systems which are electronic rather than mechanical.

In one of the presently used electronic systems, a memory capacitor coupled to the input electrode of an amplifier is alternatively charged or discharged by operator preference controls and provides bias for the amplifier. A field effect transistor amplifier provides a DC control voltage which is applied to a voltage controllable circuit element in the receiver. The viewer has access to a pair of push button preference controls which enable adjustment of the receiver characteristic in opposite directions. For example, the color saturation control comprises a button for increased color saturation and a button for decreased color saturation. Viewer adjustment consists of pressing the appropriate button until the color saturation reaches the desired level. Once the desired adjustment is made, the system remains constant until further adjusted because the capacitor coupled to the input (gate) electrode of the FET amplifier remains charged due to the inherent low leakage characteristics of the FET.

Though presently more expensive, recently developed digital electronic control systems exhibit advantages over capacitive memory systems in the areas of reproducibility and ease of automated production. A digital approach to electronic control systems comprises the use of a local clock pulse generator for providing a train of clock pulses, applied via a preference control, to a reversible binary counter. The viewer preference control determines the duration of clock pulse application, that is, the number of pulses applied, and whether pulses cause the counter to "count up" or "count down". The output signal of the counter is a binary representation of the arithmetic sum of clock pulses which have been applied. For example, if 10 clock pulses are coupled to the counter causing it to count up, the output of the counter would have a numeric equivalent of 10 expressed in binary code. If 6 clock pulses are then coupled to the counter causing it to count down, the counter output would have a numeric equivalent of 4. The output of the counter is coupled to a digital-to-analog converter which produces a DC voltage suitable for application to a voltage dependent circuit element. When clock pulses are applied to the counter, a binary coded output corresponding to the number of pulses applied results. The output voltage of the digital-to-analog converter (the control voltage) increases in proportion to the number of clock pulses applied.

Operation and appearance of the digital system are essentially the same as discussed above for the capacitive memory system. The direction in which the control voltage, and hence the receiver characteristic, is changed is controlled by viewer selection of either an "up" or "down" button and the degree of change is controlled by the length of time which that button is depressed. Because the clock pulse generator can be controlled by electronic switching signals, such digital systems are readily adaptable to remote control operation. In the absence of clock pulses, the counter output signal, and the control voltage will remain unchanged. As a result, once adjusted to viewer preference, the system maintains its adjustment.

While such digital control systems offer advantages, there are some difficulties encountered, among them, the random starting point of the controls after periods of receiver deactivation caused by the loss of binary information stored in the counter. Current solutions to this problem require continued power application to the control system during periods of receiver deactivation.

SUMMARY OF THE INVENTION

A broadcast receiver has a voltage adjustable characteristic including a common control means broadcast a control voltage in response to a binary counter data configuration. The counter is controlled by operator preference means and may be reset to a predetermined data configuration by operation of preset means.

OBJECTS OF THE INVENTION

Accordingly, it is an object of the present invention to provide a novel boroadcast receiver.

It is a further object of the present invention to provide a novel digital electronic preference control system for a broadcast receiver.

It is still a further object of the present invention to provide a novel digital electronic control system, which is resettable to a predetermined characteristic, for a broadcast receiver.

BRIEF DESCRIPTION OF THE DRAWINGS

The features of the present invention which are believed to be novel are set forth with particularity in the appended claims. The invention, together with further objects and advantages thereof, may best be understood by reference to the following description in conjunction with the accompanying drawings in which like reference numerals identify like elements and in which:

DESCRIPTION OF THE PREFERRED EMBODIMENT

Figure 1:
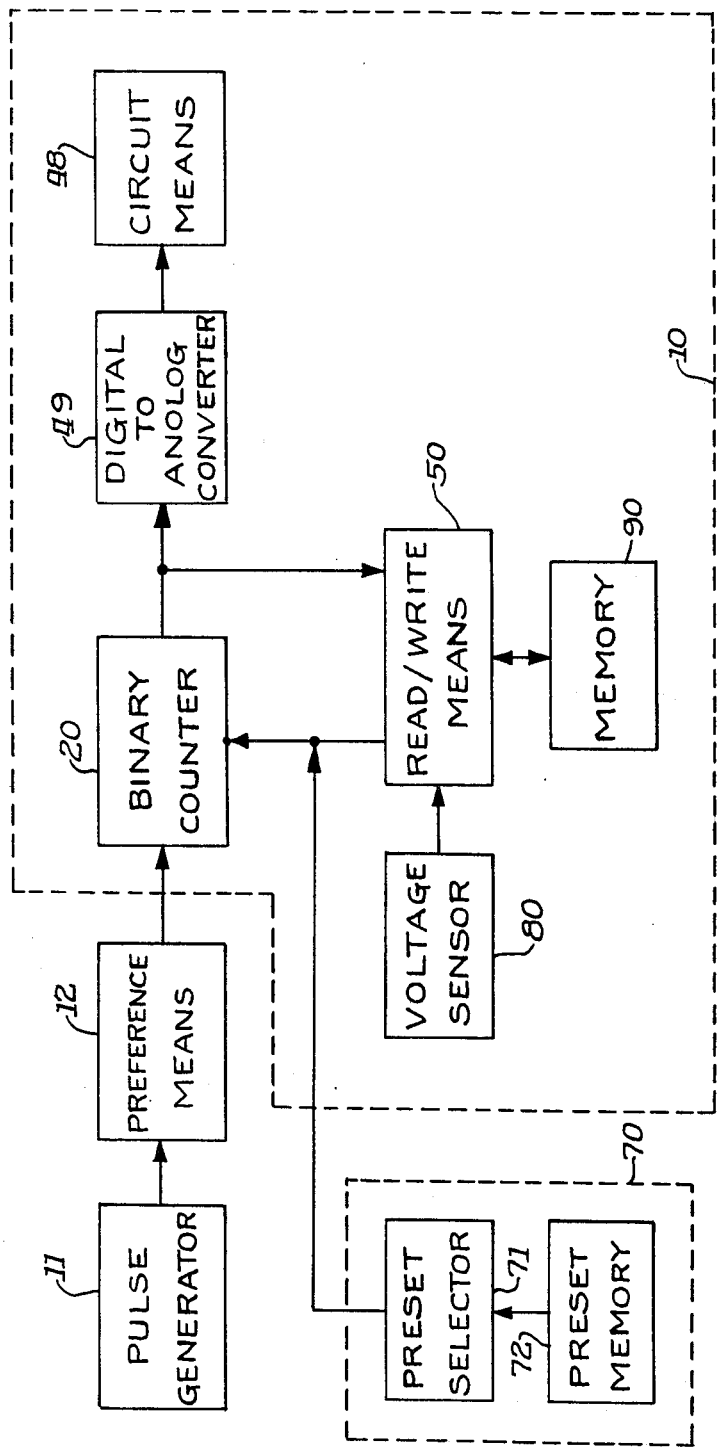
FIG. 1 is a block diagram of a portion of a broadcast receiver incorporating the present invention.

FIG. 1 shows a block diagram representation of a circuit constructed in accordance with the present invention. Common control means (indicated by dashed line block 10) include a reversible binary counter 20 having its output coupled to a digital-to-analog converter 49 which, in turn, is coupled to a circuit means 48. A read/write means 50 couples binary counter 20 and a memory 90. The output of counter 20 contains a binary data configuration which is converted by digital-to-analog converter 49 to a discrete voltage corresponding to the numeric equivalent of the binary data. The output of converter 49 develops a control voltage for application to circuit means 48 which should be understood to include circuitry for adjusting a receiver characteristic as a function of the control voltage. For example, circuit means 48 may include a variable gain amplifier, a variable capacitance varactor diode, or a voltage variable resistor.

A pulse generator 11 supplies pulses to a preference means 12, which, in turn, is coupled to binary counter 20. Preference means 12 is responsive to operator adjustment for controlling both the number of pulses supplied to counter 20 and its direction of counting. Since binary counter 20 is reversible, the numeric equivalent of the binary data in its output may be selectively increased or decreased. In addition, binary counter 20 includes means permitting the imposition of an external data configuration irrespective of the existing data configuration. The counter has this capability in its "set" mode which will be discussed below.

In operation, pulses from pulse generator 11 are selectively coupled to binary counter 20 by preference means 12, in response to operator action. The change in binary data in the output of counter 20 caused by the applied pulses produces a corresponding change in the control voltage developed by converter 49 which, in turn, causes a change in the receiver characteristic controlled by circuit means 48. For example, if the controllable receiver characteristic is color saturation of a television receiver display, operator actuation of preference means 12, in conjunction with pulse generator 11, binary counter 20, digital-to-analog converter 49, and circuit means 48 results in changes in color saturation. Preference means 12 may be actuated to cause either an increase or decrease in saturation. Most simply, preference means 12 includes two momentary contact type switches. To increase color saturation, the operator actuates the saturation increase switch causing counter 20 to count in one direction until the desired saturation level is achieved. Similarly for decreased saturation, the saturation decrease switch is actuated causing counter 20 to count in the opposite direction.

The characteristic of a binary counter is such that its output data configuration is lost in the absence of electrical power. Thus the last receiver characteristic setting is lost each time the receiver is deactivated or turned off, which is undesirable. In accordance with one aspect of the invention, read/write means 50, memory 90 and voltage sensor 80 coact to preserve the last binary data configuration in the counter upon deactivation of the receiver.

Read/write means 50 provides bilateral information transfer between binary counter 20 and memory 90. When actuated in the read mode, read/write means 50 imposes the binary data configuration of counter 20 upon memory 90. When actuated in a write mode, read/write means 50 transfers the data configuration stored in memory 90 to counter 20. Voltage sensor 80 controls the direction of information transfer of read/write means 50 and is responsive to the operating potential of the receiver. In particular, voltage sensor 80 is responsive to receiver operating potential changes resulting from activation or deactivation of the receiver. During deactivation transitions the existing binary configuration of counter 20 is stored in memory 90 by the combined actions of voltage sensor 80 and read/write means 50. Subsequently, during the next activation transition, the stored data configuration is transferred from memory 90 to counter 20. This results in resetting or reconfiguring the binary counter, and hence the condition of circuit means 48, to the last setting prior to receiver deactivation.

The counter of FIG. 1 may be configured or set to a predetermined receiver characteristic by a preset means 70 which includes a preset memory 72 selectively coupled to the set inputs (S) of counter 20 by a preset selector 71. Preset memory 72 may be a non-volatile, non-erasable memory, in which data is permanently stored and remains after a "read out"; a non-volatile, erasable memory combined with means for automatically refreshing it after every read out; or fixed circuit means which provide a source of binary data. In any event, the binary data configuration stored in preset memory 72 corresponds to a predetermined receiver characteristic. Upon operator activation of preset selector 71, this data configuration is imposed upon binary counter 20. As previously mentioned, the binary data in the output of counter 20 is converted by digital-to-analog converter 49 to a control voltage, while is supplied to circuit means 48 for controlling the receiver characteristic. The imposition of the data configuration in preset memory 72 on counter 20 overrides any previously developed data configuration. As will be explained below, in accordance with another aspect of the invention, the operator may make further adjustments to the counter, thus effectively "building on" or "touching up" the configuration imposed on the counter by preset means 70. Again, upon subsequent receiver deactivation, voltage sensor 80, read/write means 50 and memory 90 coact to cause the last data configuration of the counter to be stored in memory 90 and reimposed upon subsequent activation of the receiver.

Figure 2:
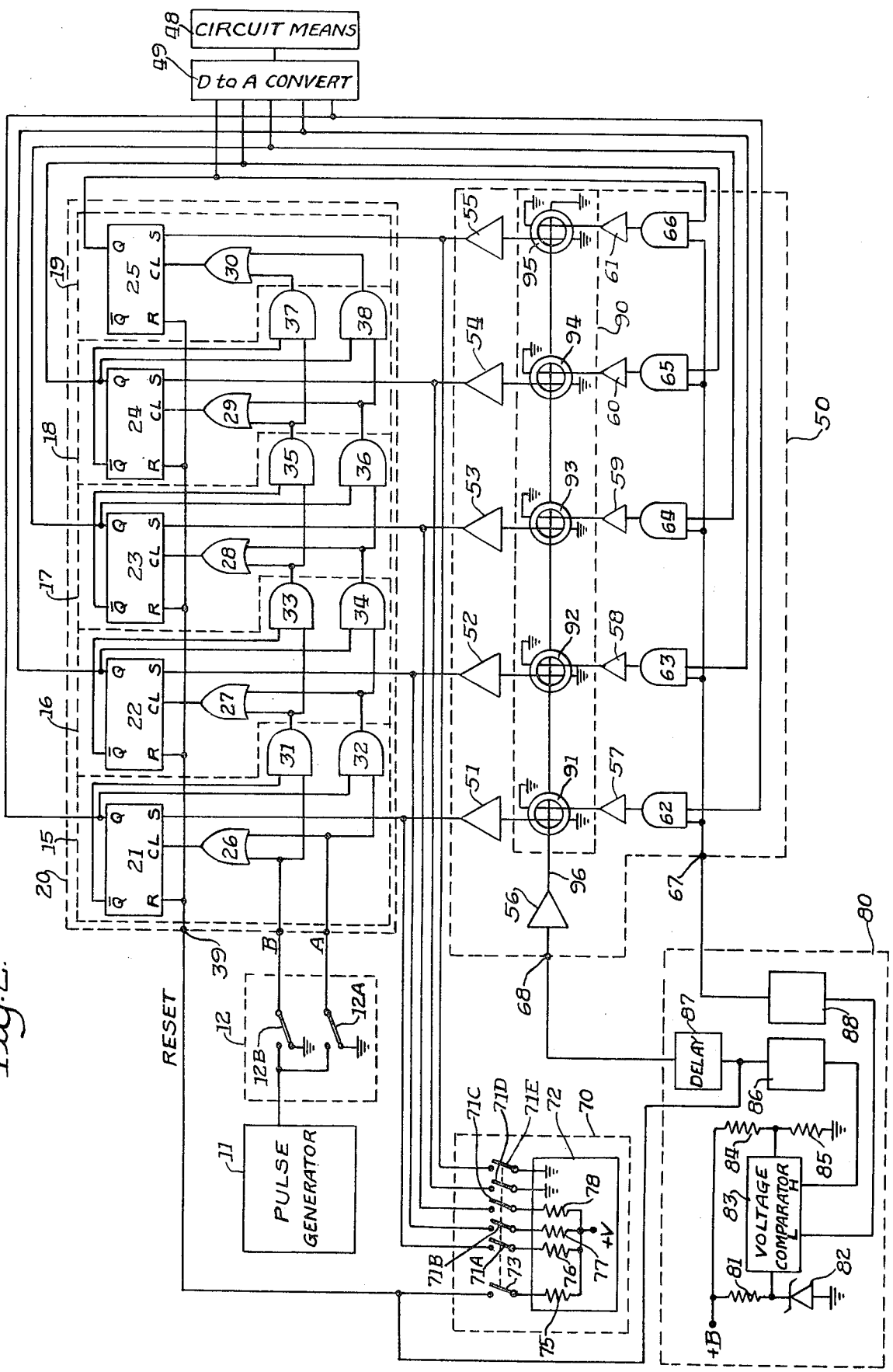
FIG. 2 is a partial schematic, partial logic diagram of the circuit shown in block form in FIG. 1.

Referring to FIG. 2, the dashed line boxes indicate preference means 12, binary counter 20, the individual bit stages 15–19 of the counter, read/write means 50, preset means 70, preset selector 71, voltage sensor 80 and memory 90. Input terminals A and B of binary counter 20 are connected to pulse generator 11 through a pair of switches 12A and 12B, respectively, included in preference means 12 and upcounting or downcounting is accomplished by activating the appropriate switch. The Q outputs of flip-flops 21–25 in counter 20 are individually coupled to corresponding inputs of digital-to-analog converter 49, the output of which is coupled to circuit means 48, and to inputs of a plurality of AND gates 62–66, respectively. The second inputs of AND gates 62–66, respectively. The second inputs of AND gates 62–66 (hereafter referred to simply as AND's 62–66) are coupled to a terminal 67. The output of AND 62 is coupled through a write amplifier 57 to a memory core 91 in memory 90. In a similar manner the outputs of AND's 63–66 are coupled through write amplifiers 58–61 to the inputs of memory cores 92–95. The output of memory core 91 is coupled through a sense amplifier 51 to the S input of flip-flop 21. Similarly, the outputs of memory cores 92–95 are coupled through sense amplifiers 52–55 to the S inputs of flip-flops 22–25. A command line 96 passes through memory cores 91–95 and is coupled to terminal 68 by an amplifier 56.

Preset means 70 includes a preset memory 72 having five outputs coupled to preset selector 71 which comprises tandemly actuated normally-open momentary contact switches 71A–71E, inclusive. The outputs of these switches are coupled to the S terminals of flip-flops 21–25, respectively. In addition preset selector 71 includes a reset switch 73 which is mechanically coupled to switches 71A–71E. A reset terminal 39 on counter 20 is coupled to switch 73 and to the output of a multivibrator 86 in voltage sensor 80.

Voltage sensor 80 includes a voltage comparator 83, a Zener diode 82, monostable multivibrators 86 and 88 and delay means 87. Receiver B+ is connected to a voltage divider formed by resistors 84 and 85, and their junction connected to a first input of comparator 83. A second input of comparator 83 is coupled to the cathode of Zener diode 82, which is supplied from B+ through a resistor 81. The high output (H) of comparator 83 is activated when the voltage at its first input exceeds that of its second input and is coupled to monostable multivibrator 86. The output of multivibrator 86 is coupled to both delay means 87, which, in turn, is coupled to terminal 68 of amplifier 56, and reset terminal 39 of counter 20. The low output (L) of comparator 83 is activated when the voltage at its input decreases below that of its second input and is coupled to a monostable multivibrator 88, the output of which is coupled to terminal 67 of read/write means 50.

Before discussing the operation of a binary counter in detail, it will be helpful to consider binary numbers. The binary system is one of positional notation based upon powers of 2, rather than powers of 10 as is the familiar decimal system. Any decimal number may be expressed by an appropriate sequence of 0's and 1's where each position in the sequence represents a decreasing power of 2. For example, decimal 5 is expressed in binary form as $1(\times 2^2)+0(\times 2^1)+1(\times 2^0)$ or simply as 101 since it is unnecessary to specify the descending powers of 2. In a five stage counter similar to the one in FIG. 2, the maximum count is 16+8+4+2+1=31. Including zero, the counter has 32 counts. Decimal 5 appears as 00101. Similarly, decimal 15 is binary 01111, etc.

In the ensuing description, a 1 indicates a high logic level or voltage and a 0 indicates a low level or voltage (corresponding to schematic ground in the figures). It will be understood that the actual voltages corresponding to logic 1's and 0's are dictated by the circuit parameters. Positive logic is used throughout.

Multistage binary counters such as counter 20 in FIG. 2 are well known in the art and are composed of a number of primay units or bit stages. Counter 20 includes five such bit stages 15–19 which are identical with the exception of bit stage 19, assigned the highest power of 2. The difference, as will become clear after the discussion below, is that bit stage 19 does not include data transfer or carry-over components. Because the operation of any adjacent pair of bit stages is sufficient to describe the action of this counter, the detailed discussion will be limited to stages 15 and 16.

Bit stage 15 includes a pair of AND's 31 and 32, an OR gate (26) (hereafter referred to simply as OR 26) and a flip-flop 21. Bit state 16 includes a pair of AND's 33 and 34, an OR 27 and a flip-flop 22. An AND has a 0 at its output unless both inputs are at 1, in which case its output is at 1. An OR has its output at 0 only when both its inputs are at 0, all other input combinations producing a 1 level output. Flip-flops 21–25 are of the J–K type with set and reset capability which comprise bistable multivibrators having two output terminals designated Q and $\overline{Q}$, the signal at $\overline{Q}$ being the inverse or alternate of that of Q, and five input terminals designated S, R, C, J and K. The J and K inputs are not indicated on the flip-flops but should be understood to be connected to a logic 1 voltage. A signal voltage transition from 0 to 1 (positive edge) at CL (clock terminal) causes the Q and $\overline{Q}$ signal outputs to flip, that is, the signal output previously at 1 goes to 0 and vice versa. A 1 level signal at S (set terminal) results in Q being at 1 and $\overline{Q}$ being at 0, and a 1 level signal at R (reset terminal) results in Q at 0 and $\overline{Q}$ at 1.

When upcounting, a 0 to 1 binary bit transition in the stage does not produce a transition (carry) pulse for the next bit stage whereas a 1 to 0 binary bit transition does. On the contrary, when counting down, a 1 to 0 binary bit transition does not produce a transition pulse whereas a 0 to 1 binary bit transition does. Transition pulses are generated by logic control circuitry in each bit stage (AND's 31 and 32 and OR 27 in stage 2, for example). The transition pulses are developed at the Q output during upcounting and at the $\overline{Q}$ output during downcounting.

The reversible counter is arranged such that a 1 level pulse at terminal A produces an increase (upcounting) in counter output signal, whereas a 1 level pulse at terminal B produces a decrease (downcounting) in counter output signal. Terminal A is connected to an input of each of OR 26 and AND 32. Terminal B is connected to an input of each of OR 26 and 31. The output of OR 26 is connected to the CL input of flip-flop 21 which has its Q output connected to the second input of AND 32 and its $\overline{Q}$ output connected to the second input of AND 31. The output of AND 32 is connected to inputs of OR 27 and AND 34 and the output of AND 31 is connected to inputs of OR 27 and AND 33. The output of OR 27 is connected to the CL input of flip-flop 22. The Q output of flip-flop 22 is connected to the second input of AND 34 and the $\overline{Q}$ output is connected to the second input of AND 33. As mentioned, the Q outputs of both stages 21 and 22 (as well as all other stages of the counter) are connected to appropriate terminals on converter 49 and appropriate inputs of AND's 62–66.

Upcounting is most easily understood if the counter stages are assumed to be at 0, that is, their Q outputs are at 0. Thus the Q outputs of flip-flops 21 and 22 are at 0, the $\overline{Q}$ outputs are at 1 and the R, S and CL terminals are at 0. Assume a 1 level clock pulse is applied to terminal A. One input of OR 26 is placed at 1 by the clock pulse and its output goes to 1, driving the Cl output of flip-flop 21 causing its Q output signal to go 1. However, because the time required to actuate both OR 26 and flip-flop 21 is greater than the duration of the clock pulse, the Q output of flip-flop 21 (and hence one input of AND 32) is still at 0 when the 1 level clock pulse is applied to the other input of AND 32. As a result, AND 32 does not respond. The next clock pulse causes AND 32 to produce a transition or carry pulse which is coupled to the C input of flip-flop 22 by OR 27. Thus, only clock pulses which cause a 1 to 0 Q output transition of stage 21 result in a carry pulse to stage 22. Flip-flop 22 is, therefore, switched in response to every other pulse applied to terminal A. In a similar manner AND 34 develops a transition pulse upon each 1 to 0 transition of flip-flop 22 (corresponding to every fourth clock pulse at terminal A). The process continues with AND 36 responding to 1 to 0 transitions of flip-flop 23 (every eighth clock pulse) and so on.

Application of clock pulses to terminal B of counter 20 produces downcounting by a process similar to that shown above for upcounting. AND 31 has its inputs coupled to terminal B and the $\overline{Q}$ output of flip-flop 21. Similarly, AND's 33, 35 and 37 are responsive to the $\overline{Q}$ outputs of flip-flops 22–25. Because the $\overline{Q}$ output is always the inverse of that of the Q output, AND 31 responds to Q output 0 to 1 transitions of flip-flop 21. In the manner described above for upcounting, flip-flop 21 responds to each clock pulse, flip-flop 22 to every second pulse, flip-flop 23 to every fourth pulse and so on. At any given time, then, the data configuration existing at the Q outputs of counter 20 is a binary representation of the arithmetic sum of applied clock pulses.

In operation, actuation of either preference switch 12A or 12B couples pulses from pulse generator 11 to terminal A or B of binary counter 20, respectively. While perference means 12 is shown as switches 12A and 12B, they may take a variety of other forms. For example, in a remotely controllable system, switches 12A and 12B may include a pair of AND gate each having one input coupled to pulse generator 11 and a second input coupled to a remote control command responsive voltage.

During upcounting, pulses from pulse generator 11 are supplied to terminal A of counter 20 by switch 12A and the total number of applied pulses is accumulated and represented in binary format by the appropriate combination of 0's and 1's at the Q outputs of flip-flops 21–25. The output signal of counter 20 is applied to digital-to-analog converter 49 and causes an appropriate incremental change in the control voltage applied to circuit means 48. The voltage change at the output of converter 49 may be either a linear function of the arithmetic sum of pulses applied to counter 20, or it may be weighted, that is, caused to change control voltage output by varying amounts within selected portions of the counter's operating range.

Similarly, operator actuation of switch 12B results in downcounting of binary counter 20 and the control voltage produced by converter 49 is incrementally changed in the opposite direction. By way of example, assuming a color saturation control in a color television receiver display, the viewer increases saturation by depressing switch 12A (decrease by depressing switch 12B) until a desired level is achieved.

In accordance with an important aspect of the invention, once the receiver characteristic is adjusted to viewer preference, it is returned to the same level subsequent to receiver deactivation. This is accomplished by bringing the binary counter to the same data configuration which existed prior to deactivation. Assume that the binary data configuration of counter 20 at the time of receiver deactivation is represented by flip-flops 21, 23 and 25 having their Q outputs at 1 and flip-flops 22 and 24 having their Q outputs at 0. A change in operating potential in the receiver, indicative of a deactivation transition, results in a decrease in voltage at the junction of resistors 84 and 85 below that of reference diode 82 and comparator 83 triggers multivibrator 88 which produces a logic 1 signal at terminal 67 of read/write means 50. Each of the AND's 62–66 thus have one input at 1. During the pulse period of multivibrator 88, AND's 62, 64 and 66 have their second inputs at 1, whereas AND's 63 and 65 have only one input at 1. Therefore, the outputs of AND's 62, 64 and 66 are at 1 and the outputs of AND's 63 and 65 are at 0. The 1 level output signals of AND's 62, 64 and 66 are coupled through write amplifiers 57, 59 and 61 on set memory cores 91, 93 and 95, respectively. Conversely, memory cores 92 and 94 are not set and correspond to 0 digit storage. Memory 90 is non-volatile and erasable. Memory cores 91-95 are shown schematically and comprise magnetic cores which are polarized, or oriented, by the application of energy through proximate electrical conductors called write lines. Once polarized by a current surge, the cores remain so oriented until disturbed and form an information storage or memory. When a second current surge is applied to other proximate conductors called read lines, those cores which are polarized are reset and generate a voltage in opposition to the second current whereas cores not polarized are passive. As a result, the application of this second current to all the cores in the memory generates voltages from only cores previously driven by 1 level signals on their write lines. Once the stored information is "read out" all cores are configured to logic 0 and the stored information is lost. However, because information storage in memory 90 is virtue of magnetic polarization, it retains stored data, until read out, even in the absence of operating potentials, i.e., when the receiver is off.

Upon activation of the receiver, the voltage at the junction of resistors 84 and 85 exceeds that of reference diode 82 and comparator 83 triggers multivibrator 86. The output of multivibrator 86 applies a 1 level signal to reset terminal 39 of counter 20. The R inputs of all of flip-flops 21-25 are placed at 1 and their Q outputs driven to 0. The output signal of multivibrator 86 is delayed by delay means 87 to permit reset of counter 20 before placing a 1 level signal on terminal 68. Amplifier 56 drives a current into read line 96 and the voltages generated by the "set" memory cores 91, 93 and 95 are detected and amplified by sense amplifiers 51, 53 and 55, respectively, which apply 1 level signals to the S inputs of flip-flops 21, 23 and 25, which drives their Q outputs to 1. Flip-flops 21, 23 and 25 thus have Q outputs at 1 whereas flip-flops 22 and 24 have Q outputs at 0. Counter 20 is thus set to the same data configuration that existed prior to deactivation.

Another aspect of the invention includes circuitry enabling a preset or predetermined characteristic to be imposed upon the receiver. Continuing the example of chroma saturation used above, a predetermined data configuration corresponding to a preselected or nominal color saturation level is maintained in preset memory 72. For purposes of explanation it is assumed that the binary configuration corresponding to this predetermined characteristic is represented by the following binary sequence, switches 71A, 71B and 71C are at logic 1 and switches 71D and 71E are at logic 0, indicated by ground.

Preset memory 72 comprises of low cost permanent memory formed by coupling a plurality of resistors 76, 77 and 78 to a source of voltage +V to develop a logic 1 voltage and by grounding switches 71D and 71E to develop a logic 0 voltage. By operator actuation of switches 71A-71E, this predetermined characteristic is imposed on the receiver. Switch 73 coacts with switches 71A-71E to couple a logic 1 voltage to reset terminal 39, and is constructed such that switch 73 is actuated before switches 71A-71E to reset counter 20 before flip-flops 21-25 are configured to conform to the preset memory. After this slight delay, the memory configuration is imposed upon the S inputs of flip-flops 21-25, resulting in flip-flops 21, 22 and 23 having their Q outputs at 1 and flip-flops 24 and 25 having their Q outputs at 0. The result in that the saturation level of the receiver corresponds to the preselected or nominal saturation level. Of course, after preset means 70 have been activated to set counter 20, subsequent deactivation of the receiver will result in the counter configuration being stored in memory 90 and reimposed during subsequent activation.

An important aspect of this invention now becomes apparent since the viewer may further adjust the receiver characteristic after the preset or nominal configuration has been imposed on the counter, whereas prior art systems, at best, placed severe limitations on the degree to which the receiver characteristics were altered when in the preset mode. Hence the advantage of a true preset is retained without the handicap of not permitting individual preference changes dictated by taste, environmental conditions or aging of components. In the invention, the predetermined data configuration of the preset memory overrides the existing preference control adjustments. Rather than simply switching from a misadjusted control to one with fixed value, there is an actual correction of the preference control setting.

What has been shown is a novel digital electronic control system which permits the imposition of a predetermined characteristic upon a broadcast receiver. The imposed characteristic then serves as a starting point for subsequent preference "touch ups". The desired settings, once attained, are maintained during receiver deactivation and re-established upon subsequent receiver activation.

While particular embodiments of the invention have been shown and described, it will be obvious of those skilled in the art that changes and modifications may be made without departing from the invention in its broader aspects, and, therefore, the aim in the appended claims is to cover all such changes and modifications as fall within the true spirit and scope of the invention.

What is claimed is:

1. A broadcast receiver including a voltage adjustable characteristic comprising:
   common control means including binary counting means, converting means for translating the data output of said counting means to a corresponding voltage, and circuit means responsive to said voltage for adjusting said voltage adjustable characteristic;
   preference means enabling operator control of said couonting means;
   preset means for resetting said counting means to a prescribed data configuration to produce a control voltage of a predetermined value corresponding to a predetermined adjustment of said adjustable characteristic; and
   means for re-establishing the last existing data configuration of said counting means upon subsequent reactivation of said receiver.

2. A broadcast receiver as in claim 1, wherein said preset means includes:

means establishing a predetermined binary data configuration and maintaining said predetermined configuration during periods of receiver deactivation.

3. A broadcast receiver as in claim 2, wherein said common control means includes:
memory means for storage of binary data; and
read/write means for transferring binary data between said counting means and said memory means.

4. A broadcast receiver as in claim 3, wherein said preset means is coupled to said counting means in a unilateral information transfer relationship by said read/write means.

5. A broadcast receiver as in claim 4, having a pulse generator providing a train of pulses, wherein said binary counting means includes:
a reversible binary counter, coupled to said pulse generator, for selectively counting up and down in response to said preference means.

6. A broadcast receiver as in claim 5, wherein said converting means includes:
a digital-to-analog converter coupled to said counter, producing a discrete voltage within a predetermined range related to the numeric equivalent of the data configuration of said counter.

7. A broadcast receiver as in claim 6, wherein said means for re-establishing includes:
means, sensing the activation-deactivation transitions of said receiver, causing said read/write means to transfer the date configuration of said memory means to said counting means during a receiver activation transition and to transfer the data configuration stored in said counting means to said memory means during a receiver deactivation transition.

8. A broadcast receiver as in claim 7, having a source of operating potential wherein said means sensing includes:
threshold means coupled to said source of operating potential establishing a reference potential; and
voltage comparison means, coupled to said threshold means determining the occurrence of said receiver transitions and producing a deactivation signal when said operating potential decreases below a predetermined potential and an activation signal when said operating potential increases above said predetermined potential.

9. A broadcast receiver as in claim 8, wherein said voltage comparison means includes:
a bistable multivibrator having one input coupled to said source of operating potential and a second input coupled to said threshold means.

10. A broadcast receiver as in claim 9, wherein said threshold means includes:
a Zener diode having its cathode resistively coupled to said source of operating potential.

* * * * *